US011561244B2

(12) United States Patent
Hsieh et al.

(10) Patent No.: US 11,561,244 B2
(45) Date of Patent: Jan. 24, 2023

(54) BOARD-LIKE CONNECTOR, DUAL-RING BRIDGE OF BOARD-LIKE CONNECTOR, AND WAFER TESTING ASSEMBLY

(71) Applicant: CHUNGHWA PRECISION TEST TECH. CO., LTD., Taoyuan (TW)

(72) Inventors: Kai-Chieh Hsieh, Taoyuan (TW); Chao-Chiang Liu, Taoyuan (TW); Meng-Chieh Cheng, Taipei (TW); Wei-Jhih Su, Taichung (TW)

(73) Assignee: CHUNGHWA PRECISION TEST TECH. CO., LTD., Taoyuan (TW)

( * ) Notice: Subject to any disclaimer, the term of this patent is extended or adjusted under 35 U.S.C. 154(b) by 15 days.

(21) Appl. No.: 17/485,288

(22) Filed: Sep. 24, 2021

(65) Prior Publication Data
US 2022/0137095 A1    May 5, 2022

(30) Foreign Application Priority Data
Nov. 3, 2020   (TW) ................................. 109138145

(51) Int. Cl.
*G01R 1/073*  (2006.01)
*G01R 31/28*  (2006.01)

(52) U.S. Cl.
CPC ..... *G01R 1/07378* (2013.01); *G01R 31/2831* (2013.01)

(58) Field of Classification Search
CPC ............ G01R 1/07378; G01R 31/2831; G01R 1/0491; G01R 1/07307; G01R 1/07385; G01R 1/36; G01R 3/00; G01R 31/2601; G01R 31/2889

USPC ...................................................... 324/754.07
See application file for complete search history.

(56) References Cited

U.S. PATENT DOCUMENTS

| | | | |
|---|---|---|---|
| 6,538,214 B2 * | 3/2003 | Khandros | H01L 21/563 29/874 |
| 2001/0004556 A1 * | 6/2001 | Zhou | H01R 13/2407 439/71 |
| 2006/0040417 A1 * | 2/2006 | Eldridge | G01R 1/07378 324/755.05 |

(Continued)

FOREIGN PATENT DOCUMENTS

WO    WO-2010018963 A2 *   2/2010 ........... G01R 1/0416

*Primary Examiner* — Tung X Nguyen
*Assistant Examiner* — Robert P Alejnikov, Jr.
(74) *Attorney, Agent, or Firm* — Li & Cai Intellectual Property (USA) Office

(57) ABSTRACT

A board-like connector, a dual-ring bridge of a board-like connector, and a wafer testing assembly are provided. The board-like connector includes a plurality of dual-ring bridges spaced apart from each other and an insulating layer. Each of the dual-ring bridges includes two carrying rings, two cantilevers respectively extending from and being coplanar with the two carrying rings, two abutting columns respectively extending from the two cantilevers along two opposite directions, and a bridging segment that connects the two carrying rings. The insulating layer connects the two carrying rings of the dual-ring bridges, and the two abutting columns of the dual-ring bridges respectively protrude from two opposite sides of the insulating layer. The two abutting columns of each of the dual-ring bridges are configured to be respectively abutted against two boards.

10 Claims, 10 Drawing Sheets

(56) References Cited

U.S. PATENT DOCUMENTS

| | | | |
|---|---|---|---|
| 2008/0074132 A1* | 3/2008 | Fan | G01R 1/07342 324/755.06 |
| 2010/0264935 A1* | 10/2010 | Erdman | G01R 1/067 324/537 |
| 2010/0285700 A1* | 11/2010 | Chow | G01R 1/06744 439/862 |
| 2017/0047734 A1* | 2/2017 | Jankowski | H01F 27/343 |
| 2017/0108547 A1* | 4/2017 | Appinger | G01R 31/2891 |
| 2019/0302148 A1* | 10/2019 | Maggioni | G01R 1/07357 |
| 2022/0146552 A1* | 5/2022 | Soma | H01R 13/2421 |

\* cited by examiner

BOARD-LIKE CONNECTOR, DUAL-RING BRIDGE OF BOARD-LIKE CONNECTOR, AND WAFER TESTING ASSEMBLY

CROSS-REFERENCE TO RELATED PATENT APPLICATION

This application claims the benefit of priority to Taiwan Patent Application No. 109138145, filed on Nov. 3, 2020. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a testing assembly, and more particularly to a board-like connector, a dual-ring bridge of a board-like connector, and a wafer testing assembly.

BACKGROUND OF THE DISCLOSURE

A conventional wafer testing device includes a testing circuit board electrically coupled to a testing apparatus and a signal transmission board that is disposed on the testing circuit board. In the conventional wafer testing device, the signal transmission board is soldered and fixed to the testing circuit board. However, when the signal transmission board is soldered to the testing circuit board, the conventional wafer testing device is easily damaged from thermal shock. Moreover, the signal transmission board and the testing circuit board are not suited to inspection and maintenance due to their being fixed to each other.

SUMMARY OF THE DISCLOSURE

In response to the above-referenced technical inadequacy, the present disclosure provides a board-like connector, a dual-ring bridge of a board-like connector, and a wafer testing assembly to effectively improve on the issues associated with conventional wafer testing devices.

In one aspect, the present disclosure provides a wafer testing assembly, which includes a signal transmission board configured to be connected to a probe head, a testing circuit board configured to be electrically coupled to a testing apparatus, and a board-like connector sandwiched between the signal transmission board and the testing circuit board. The signal transmission board includes a plurality of connection pads, and the testing circuit board includes a plurality of metal pads spaced apart from each other. The board-like connector includes a plurality of dual-ring bridges spaced apart from each other and an insulating layer. Each of the dual-ring bridges includes a first abutting segment, a second abutting segment, and a bridging segment. The first abutting segment includes a first carrying ring, a first cantilever extending from an inner lateral wall of the first carrying ring, and a first abutting column that extends from the first cantilever along a first direction. The second abutting segment includes a second carrying ring, a second cantilever extending from an inner lateral wall of the second carrying ring, and a second abutting column that extends from the second cantilever along a second direction opposite to the first direction. The bridging segment connects the first carrying ring and the second carrying ring. The insulating layer connects the first carrying rings and the second carrying rings of the dual-ring bridges. The first abutting column and the second abutting column of each of the dual-ring bridges respectively protrude from two opposite sides of the insulating layer. The first abutting columns of the dual-ring bridges respectively abut against the connection pads of the signal transmission board, and the second abutting columns of the dual-ring bridges respectively abut against the metal pads of the testing circuit board. The signal transmission board and the testing circuit board are electrically coupled to each other through the board-like connector.

Therefore, in the wafer testing assembly (or the board-like connector) of the present disclosure, the first abutting column and the second abutting column of any one of the dual-ring bridges elastically abut against two boards (e.g., the signal transmission board and the testing circuit board) by being in cooperation with the first cantilever and the second cantilever, thereby without using any soldering manner. Moreover, any one of the dual-ring bridges is detachably abutting against the two boards, so that the components of the wafer testing assembly can be easily separated from each other for facilitating the inspection and maintenance of the wafer testing assembly.

Specifically, in the wafer testing assembly (or the board-like connector) of the present disclosure, the first cantilever and the second cantilever of any one of the dual-ring bridges are respectively coplanar with the first carrying ring and the second carrying ring for increasing the manufacturing yield of the board-like connector, and when the first cantilever (or the second cantilever) of any one of the dual-ring bridges is bent by receiving an external force, a stress would be uniformly distributed on the first cantilever (or the second cantilever), thereby effectively decreasing the breaking possibility of the first cantilever (or the second cantilever) from the first carrying ring (or the second carrying ring).

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

Figure 1:
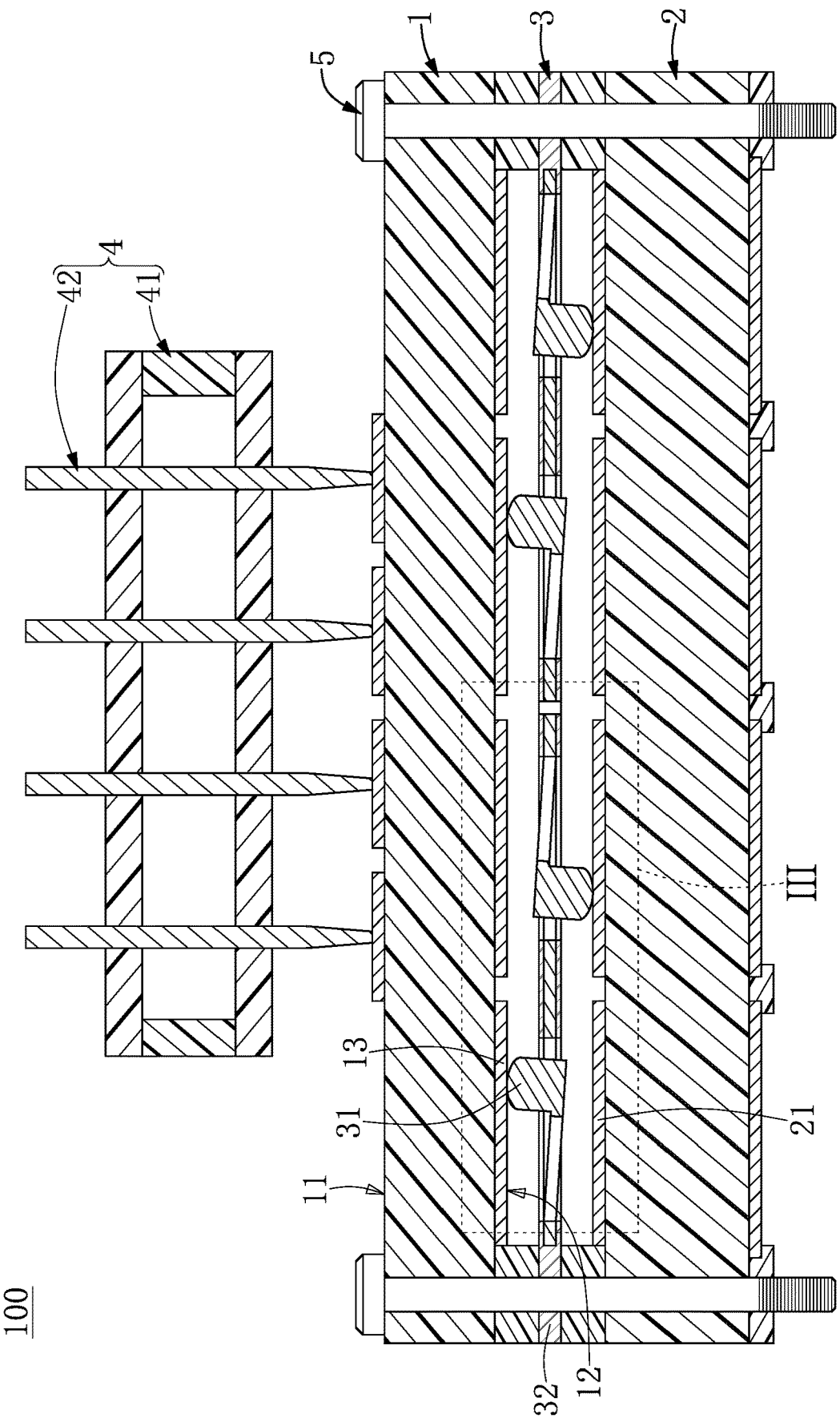
FIG. 1 is a cross-sectional view of a wafer testing assembly according to an embodiment of the present disclosure.

Referring to FIG. 1 to FIG. 10, an embodiment of the present disclosure provides a wafer testing assembly 100. It should be noted that a size and a quantity of any component of the wafer testing assembly 100 shown in FIG. 1 to FIG. 10 can be adjusted or changed according to design requirements (e.g., a length of any component can be increased, or the quantity of any component can be increased), and are not limited to the drawings.

As shown in FIG. 1 to FIG. 4, the wafer testing assembly 100 includes a signal transmission board 1 (that can be named as a space transformer 1), a testing circuit board 2 spaced apart from the signal transmission board 1, a boar-like connector 3 sandwiched between the signal transmission board 1 and the testing circuit board 3, a probe head 4 connected to the signal transmission board 1, and a screw set 5.

In the present embodiment, the screw set 5 is inserted into the signal transmission board 1, the board-like connector 3, and the testing circuit board 2 so as to fix and maintain a relative position of the signal transmission board 1, the board-like connector 3, and the testing circuit board 2. Accordingly, any electrical path in the signal transmission board 1, the board-like connector 3, and the testing circuit board 2 of the present embodiment can be established without using any soldering material, but the present disclosure is not limited thereto. For example, in other embodiments of the present disclosure not shown in the drawings, the screw set 5 of the wafer testing assembly 100 can be omitted or can be replaced by other components (e.g., the components of the wafer testing assembly 100 can be fixed to each other in an adhering manner).

It should be noted that the board-like connector 3 in the present embodiment is described in cooperation with the signal transmission board 1, the testing circuit board 2, the probe head 4, and the screw set 5, but the present disclosure is not limited thereto. For example, in other embodiments of the present disclosure not shown in the drawings, the board-like connector 3 can be independently used (e.g., sold) or can be used in cooperation with other components (e.g., the board-like connector 3 can be provided for being sandwiched between two boards so as to allow the two boards are electrically coupled to each other by the board-like connector 3). The following description describes the structure and connection relationship of each component of the wafer testing assembly 100.

Figure 2:
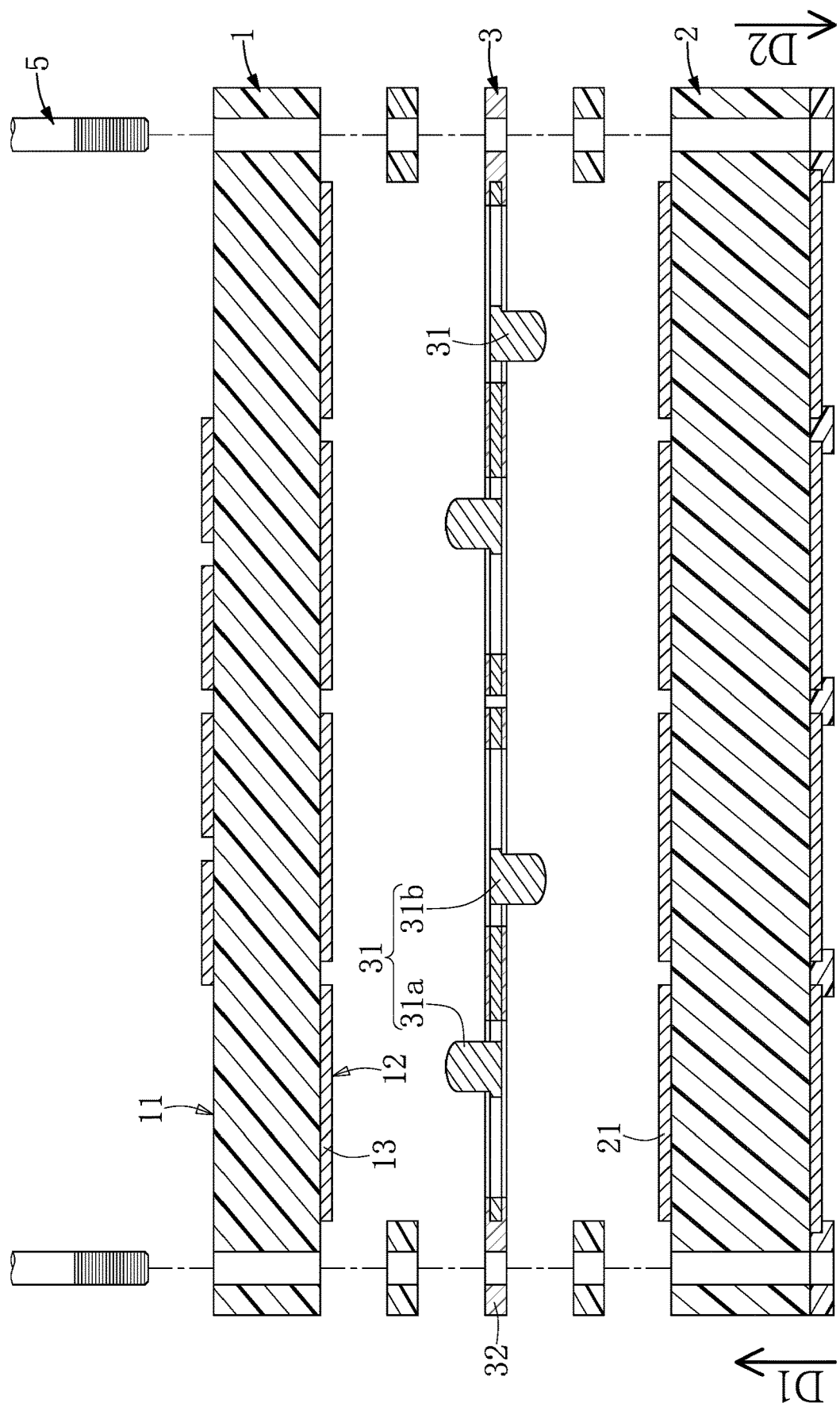
FIG. 2 is an exploded view of FIG. 1 when a probe head is omitted.

As shown in FIG. 1 and FIG. 2, the signal transmission board 1 has a top surface 11 and a bottom surface 12 that is opposite to the top surface 11. The top surface 11 of the signal transmission board 1 is configured to be connected to the probe head 4, and the bottom surface 12 of the signal transmission board 1 faces toward the board-like connector 3. The signal transmission board 1 includes a plurality of connection pads 13 arranged on the bottom surface 12 and provided to electrically couple to the probe head 4. Moreover, in other embodiments of the present disclosure not shown in the drawings, the signal transmission board 1 can be a multi-layer structure and can further include a functional board having an impedance matching effect.

The testing circuit board 2 is configured to be electrically coupled to a testing apparatus (not shown in the drawings).

The testing circuit board 2 includes a plurality of metal pads 21 arranged on a board surface thereof (e.g., a top surface of the testing circuit board 2 shown in FIG. 2) and spaced apart from each other. The metal pads 21 of the testing circuit board 2 respectively correspond in position to the connection pads 13 of the signal transmission board 1, but the present disclosure is not limited thereto. Accordingly, the testing apparatus can be configured to analyze signals transmitted from the testing circuit board 2 by being electrically coupled to the metal pads 21. It should be noted that the electrical connection manner between the testing circuit board 2 and the testing apparatus can be adjusted or changed according to design requirements. For example, in other embodiments of the present disclosure not shown in the drawings, the testing circuit board 2 can be directly assembled into the testing apparatus.

The board-like connector 3 is sandwiched between the signal transmission board 1 and the testing circuit board 2, so that the signal transmission board 1 and the testing circuit board 2 are electrically coupled to each other through the board-like connector 3. A force generated by using the signal transmission board 1 and the testing circuit board 2 to jointly clamp the board-like connector 3 can be adjusted through the screw set 5. In other words, a distance between the signal transmission board 1 and the testing circuit board 2 can be adjusted through the screw set 5, thereby controlling the force applied to the board-like connector 3.

Figure 3:
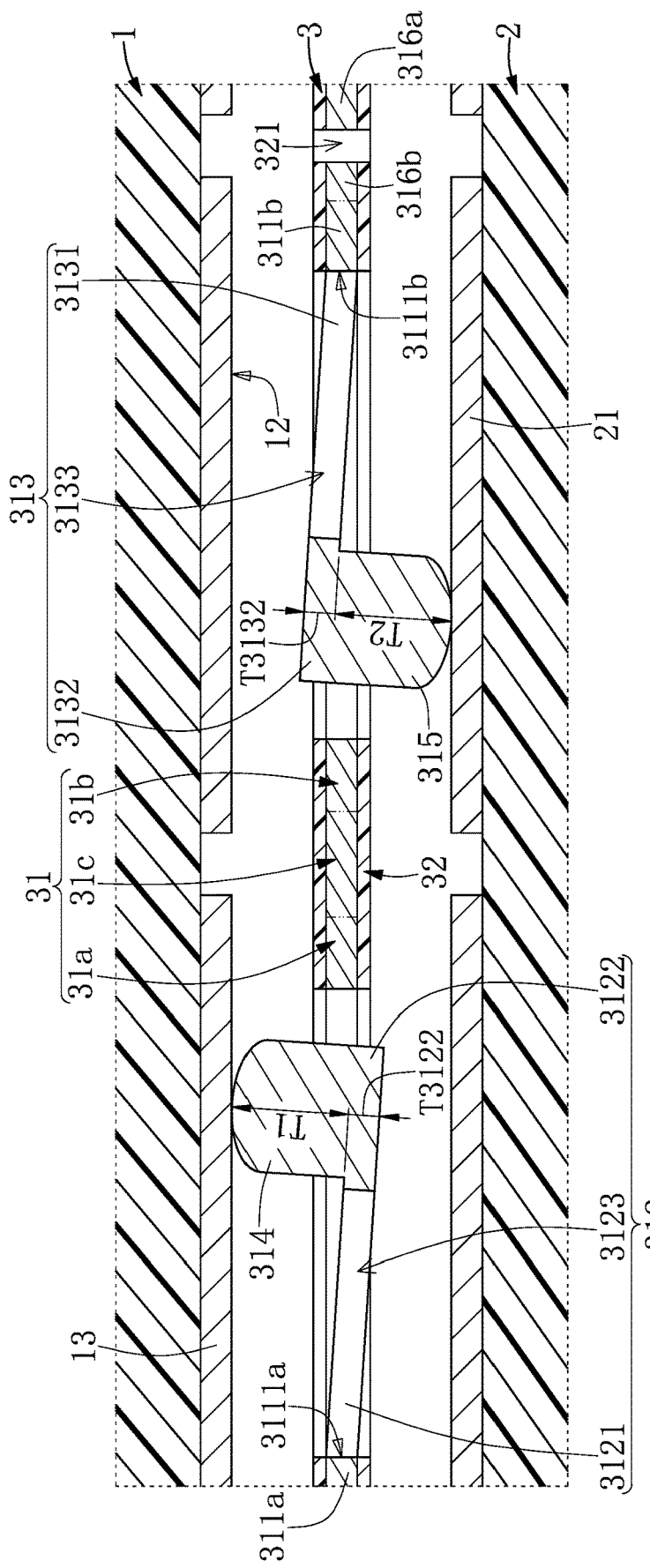
FIG. 3 shows an enlarged view of a part III of FIG. 1.
Figure 4:
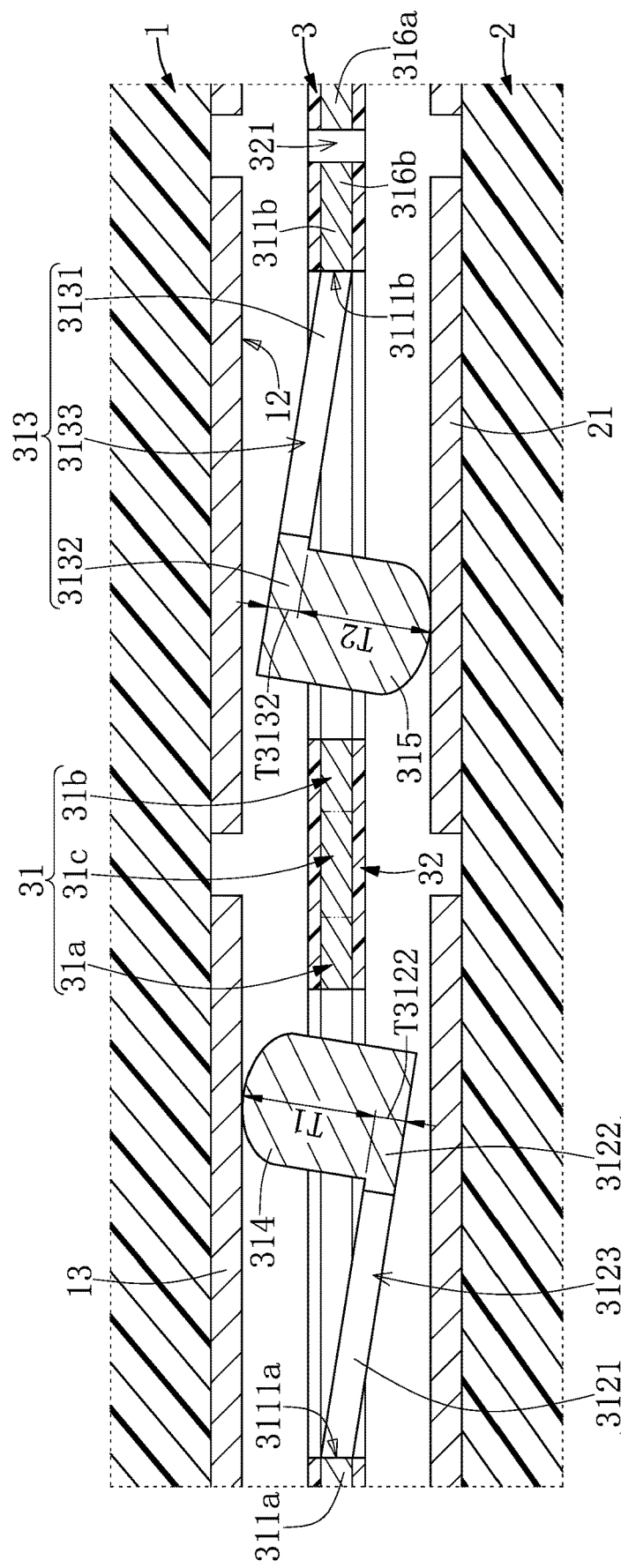
FIG. 4 shows an enlarged view of the part III of FIG. 1 in another configuration.

Specifically, as shown in FIG. 2 to FIG. 4, the board-like connector 3 includes a plurality of dual-ring bridges 31 spaced apart from each other and an insulating layer 32 that fixes the dual-ring bridges 31. It should be noted that the dual-ring bridges 31 in the present embodiment are described in cooperation with the insulating layer 32, but the present disclosure is not limited thereto. For example, in other embodiments of the present disclosure not shown in the drawings, the dual-ring bridge 31 can be independently used (e.g., sold) or can be used in cooperation with other components (e.g., the dual-ring bridge 31 can be used in cooperation with other bridges; or, the dual-ring bridge 31 can be provided for being sandwiched between two boards so as to allow the two boards are electrically coupled to each other by the dual-ring bridge 31).

As the dual-ring bridges 31 in the present embodiment are of the substantially same structure, the following description discloses the structure of just one of the dual-ring bridges 31 for the sake of brevity, but the present disclosure is not limited thereto. For example, in other embodiments of the present disclosure, the dual-ring bridges 31 can be of different structures. The following description describes the dual-ring bridge 31 without receiving an external force.

Figure 5:
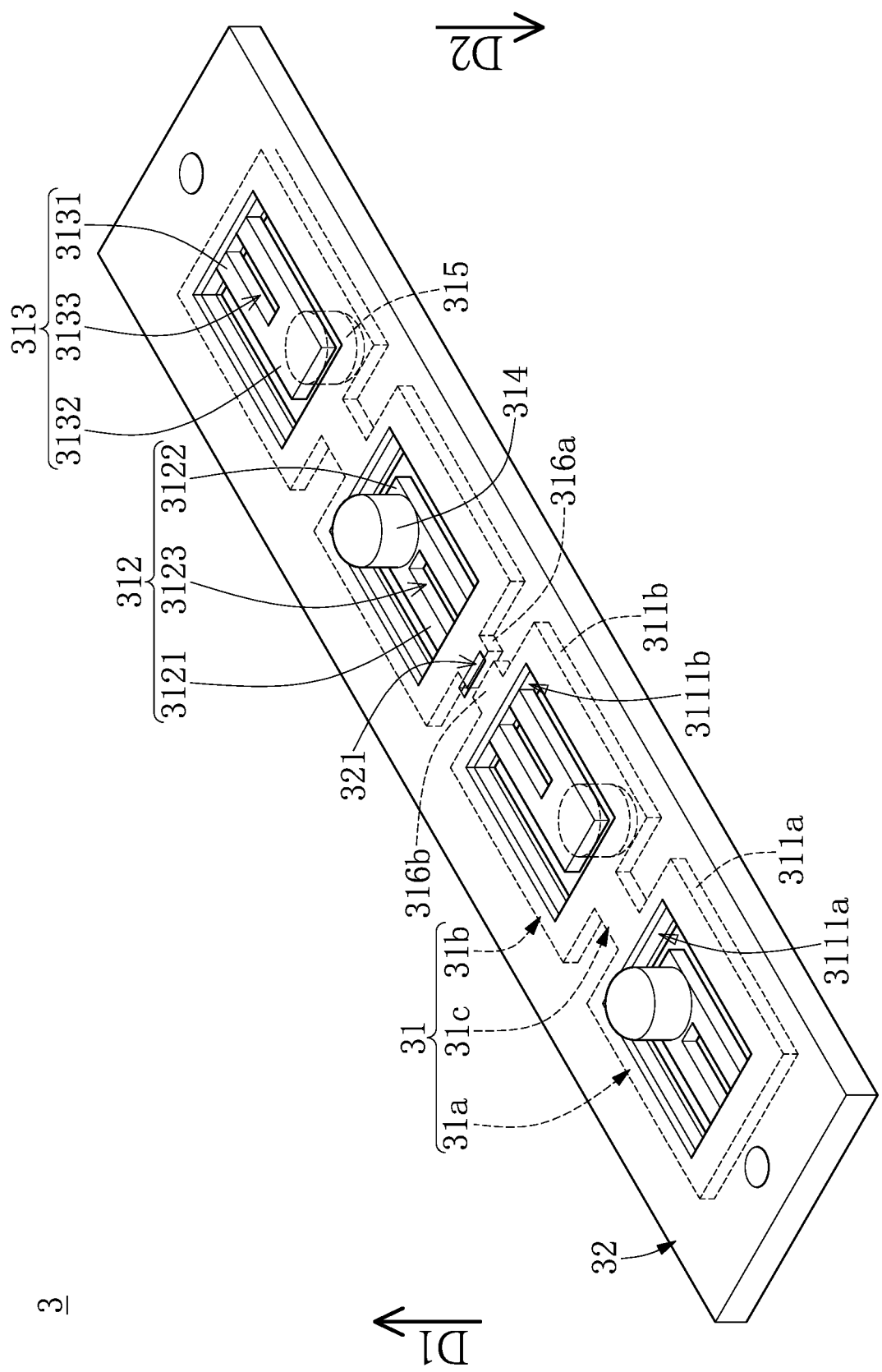
FIG. 5 is a perspective view of a board-like connector according to the embodiment of the present disclosure.
Figure 6:
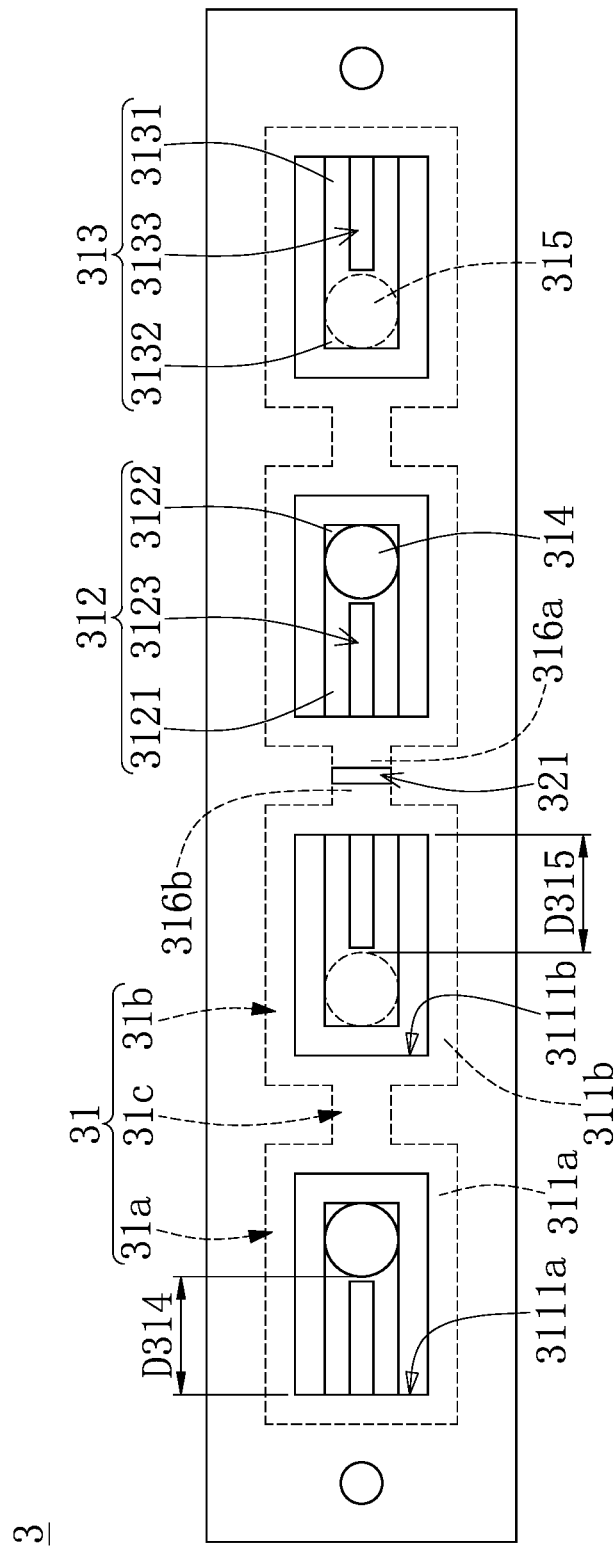
FIG. 6 is a top view of FIG. 5.
Figure 7:
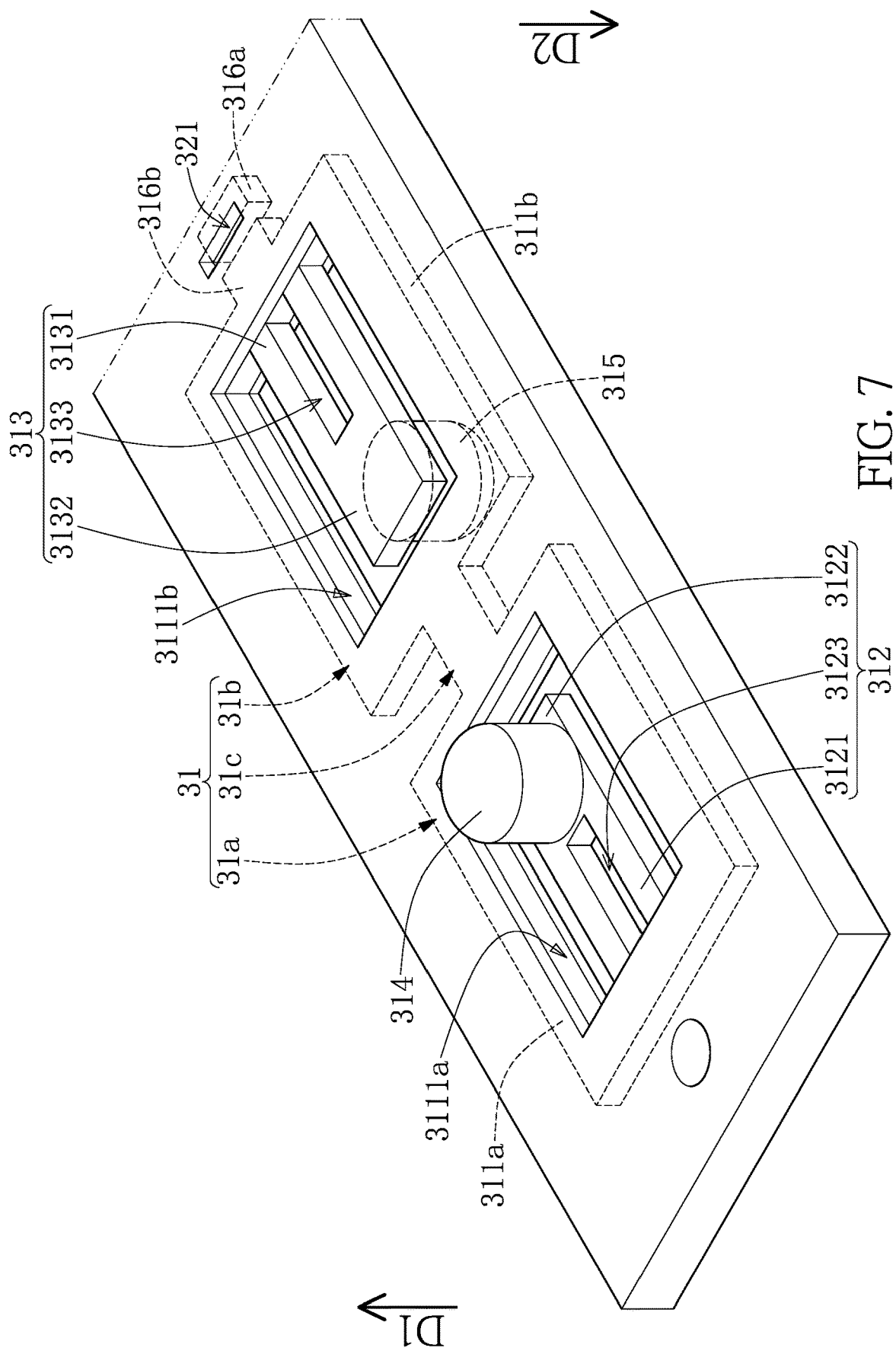
FIG. 7 is a perspective view showing a part of FIG. 5.

As shown in FIG. 5 to FIG. 7, the dual-ring bridge 31 in the present embodiment is a single one-piece conductive structure, and a nickel gold layer is preferably coated on an outer surface of the dual-ring bridge 31, but the present disclosure is not limited thereto. The dual-ring bridge 31 includes a first abutting segment 31*a*, a second abutting segment 31*b*, and a bridging segment 31*c* that connects the first abutting segment 31*a* and the second abutting segment 31*b*.

The first abutting segment 31*a* includes a first carrying ring 311*a*, a first cantilever 312 extending from an inner lateral wall 3111*a* of the first carrying ring 311*a*, a first abutting column 314 extending from the first cantilever 312, and at least one first residual arm 316*a* that extends from an outer lateral wall of the first carrying ring 311*a*. Moreover, the second abutting segment 31*b* includes a second carrying ring 311*b*, a second cantilever 313 extending from an inner lateral wall 3111b of the second carrying ring 311b, a second abutting column 315 extending from the second cantilever 313, and at least one second residual arm 316b that extends from an outer lateral wall of the second carrying ring 311b. In addition, the bridging segment 31c connects a portion of the first carrying ring 311a and a portion of the second carrying ring 311b that is adjacent to the portion of the first carrying ring 311a, so that the first abutting segment 31a and the second abutting segment 31b can be electrically coupled to each other through the bridging segment 31c, but the present disclosure is not limited thereto.

Figure 8:
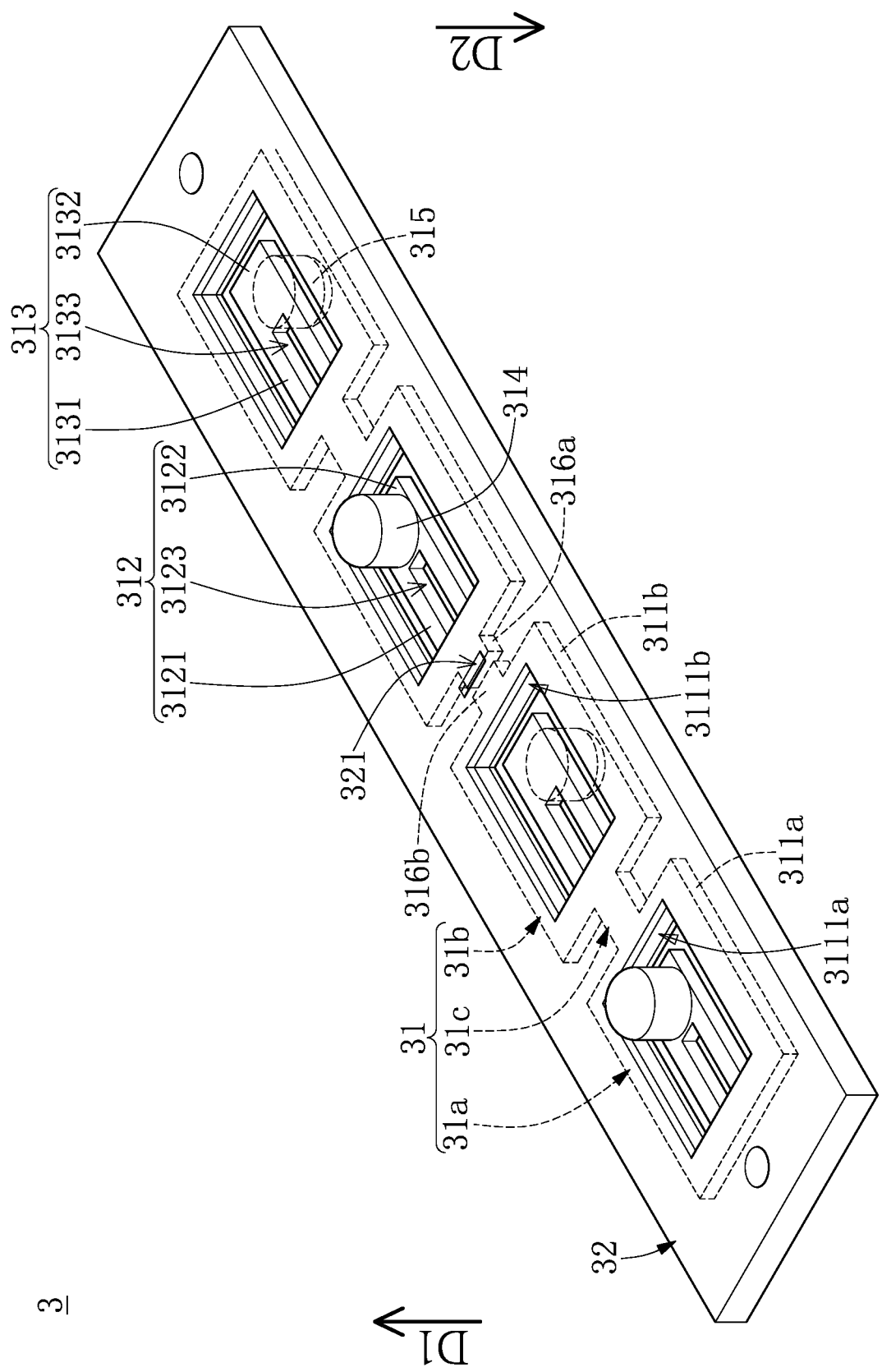
FIG. 8 is a perspective view showing the board-like connector in another configuration according to the embodiment of the present disclosure.

In the present embodiment, any one of the dual-ring bridges 31 just have the at least one first residual arm 316a or the at least one second residual arm 316b, but the present disclosure is not limited thereto. For example, in other embodiments of the present disclosure not shown in the drawings, the dual-ring bridge 31 can be provided without the at least one first residual arm 316a and/or the at least one second residual arm 316b; or, the at least one first residual arm 316a and/or the at least one second residual arm 316b can be formed in any shape other than a rectangular ring-shape; or, as shown in FIG. 8, the first cantilever 312 and the second cantilever 313 can be oriented along a same direction by being connected to the corresponding inner lateral walls 3111a, 3111b (e.g., the inner lateral walls 3111a, 3111b are respectively arranged on left sides of the first carrying ring 311a and the second carrying ring 311b).

In a reference embodiment different from the present disclosure and not shown in the drawings, at least one slanting cantilever is connected to a carrying ring by an angle, and when the at least one slanting cantilever is bent by receiving an external force, a stress would be concentrated on a connection part of the at least one slanting cantilever and the carrying ring, so that the at least one slanting cantilever is easily broken along the connection part.

However, in the present embodiment as shown in FIG. 5 to FIG. 7, the first cantilever 312 and the second cantilever 313 are limited to be respectively coplanar with the first carrying ring 311a and the second carrying ring 311b. In other words, an upper surface of the first cantilever 312 and an upper surface of the second cantilever 313 are respectively coplanar with an upper surface of the first carrying ring 311a and an upper surface of the second carrying ring 311b, and a lower surface of the first cantilever 312 and a lower surface of the second cantilever 313 are respectively coplanar with a lower surface of the first carrying ring 311a and a lower surface of the second carrying ring 311b.

Accordingly, the first cantilever 312 and the second cantilever 313 in the present embodiment are provided by being respectively coplanar with the first carrying ring 311a and the second carrying ring 311b for increasing the manufacturing yield of the board-like connector 3, and when the first cantilever 312 (or the second cantilever 313) is bent by receiving an external force, a stress would be uniformly distributed on the first cantilever 312 (or the second cantilever 313), thereby effectively decreasing a breaking possibility of the first cantilever 312 (or the second cantilever 313) from the first carrying ring 311a (or the second carrying ring 311b). In other words, any cantilever not coplanar with a carrying ring is different from the first cantilever 312 or the second cantilever 313 of the present embodiment.

Figure 9:
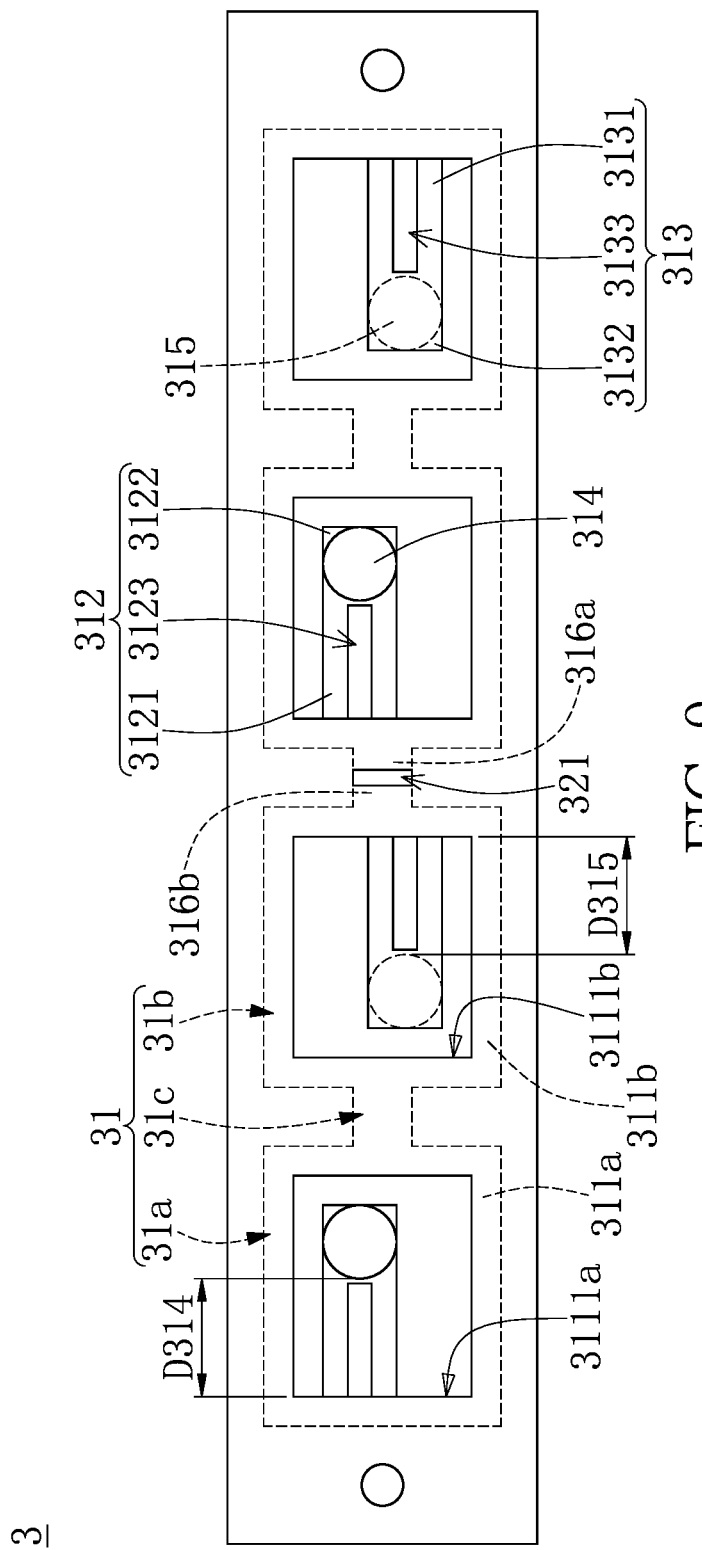
FIG. 9 is a perspective view showing the board-like connector in yet another configuration according to the embodiment of the present disclosure.

Specifically, as shown in FIG. 5 to FIG. 7, the first cantilever 312 and the second cantilever 313 in the present embodiment are opposite to (or face toward) each other (e.g., the first cantilever 312 and the second cantilever 313 are connected to the inner lateral walls 3111 arranged at two opposite sides), and the first cantilever 312 and the second cantilever 313 are arranged along a straight direction, but the present disclosure is not limited thereto. For example, in other embodiments of the present disclosure not shown in the drawings, the first cantilever 312 and the second cantilever 313 can have different lengths according to design requirements; or, as shown in FIG. 9, the first cantilever 312 and the second cantilever 313 can be arranged along a direction other than the straight direction.

Moreover, as shown in FIG. 5 to FIG. 7, the first abutting column 314 extends from the upper surface of the first cantilever 312 along a first direction D1, and the second abutting column 315 extends from the lower surface of the second cantilever 313 along a second direction D2 that is opposite to the first direction D1. The shape of the first abutting column 314 in the present embodiment is substantially identical to the shape of the second abutting column 315, but the present disclosure is not limited thereto.

Specifically, in order to allow the dual-ring bridge 31 to have a better mechanical property and a better electrical transmission relative to the signal transmission board 1 and the testing circuit board 2, the dual-ring bridge 31 is preferably provided with at least one following feature, but the present disclosure is not limited thereto. For example, in other embodiments of the present disclosure not shown in the drawings, the dual-ring bridge 31 can be provided without any following feature.

In the present embodiment, any portion of the first cantilever 312 has a same thickness, and the first cantilever 312 includes a first arm portion 3121 connected to the corresponding inner lateral wall 3111a and a first free end portion 3122 that extends from the first arm portion 3121. The first arm portion 3121 has a first adjustment hole 3123 penetrating there-through and extending from the first free end portion 3122 to the corresponding inner lateral wall 3111a, but the present disclosure is not limited thereto. For example, in other embodiments of the present disclosure not shown in the drawings, the first adjustment hole 3123 can be spaced apart from the first free end portion 3122 (or the corresponding inner lateral wall 3111a) by a distance.

Accordingly, the first arm portion 3121 in the present embodiment is divided into two arms through the first adjustment hole 3123, thereby providing a better balance performance to the first free end portion 3122. Moreover, an elastic force provided from the first arm portion 3121 can be effectively controlled by changing a size or a shape of the first adjustment hole 3123, thereby satisfying different design requirements.

The first abutting column 314 is integrally connected to the first free end portion 3122, and the first abutting column 314 is spaced apart from the corresponding inner lateral wall 3111a by a distance D314 being within a range from 100 µm to 600 µm. In other words, a length of the first abutting column 314 can be substantially within a range from 100 µm to 600 µm, but the present disclosure is not limited thereto. Moreover, a first thickness T1 of the first abutting column 314 with respect to the first free end portion 3122 is 100% to 300% of a thickness T3122 of the first free end portion 3122.

In the present embodiment, any portion of the second cantilever 313 has a same thickness, and the second cantilever 313 includes a second arm portion 3131 connected to the corresponding inner lateral wall 3111b and a second free end portion 3132 that extends from the second arm portion 3131. The second arm portion 3131 has a second adjustment hole 3133 penetrating there-through and extending from the second free end portion 3132 to the corresponding inner lateral wall 3111b, but the present disclosure is not limited thereto. For example, in other embodiments of the present disclosure not shown in the drawings, the second adjustment hole 3133 can be spaced apart from the second free end portion 3132 (or the corresponding inner lateral wall 3111b) by a distance.

Accordingly, the second arm portion 3131 in the present embodiment is divided into two arms through the second adjustment hole 3133, thereby providing a better balance performance to the second free end portion 3132. Moreover, an elastic force provided from the second arm portion 3131 can be effectively controlled by changing a size or a shape of the second adjustment hole 3133, thereby satisfying different design requirements.

The second abutting column 315 is integrally connected to the second free end portion 3132, and the second abutting column 315 is spaced apart from the corresponding inner lateral wall 3111b by a distance D315 being within a range from 100 μm to 600 μm. In other words, a length of the second abutting column 315 can be substantially within a range from 100 μm to 600 μm, but the present disclosure is not limited thereto. Moreover, a second thickness T2 of the second abutting column 315 with respect to the second free end portion 3132 is 100% to 300% of a thickness T3132 of the second free end portion 3132.

Figure 10:
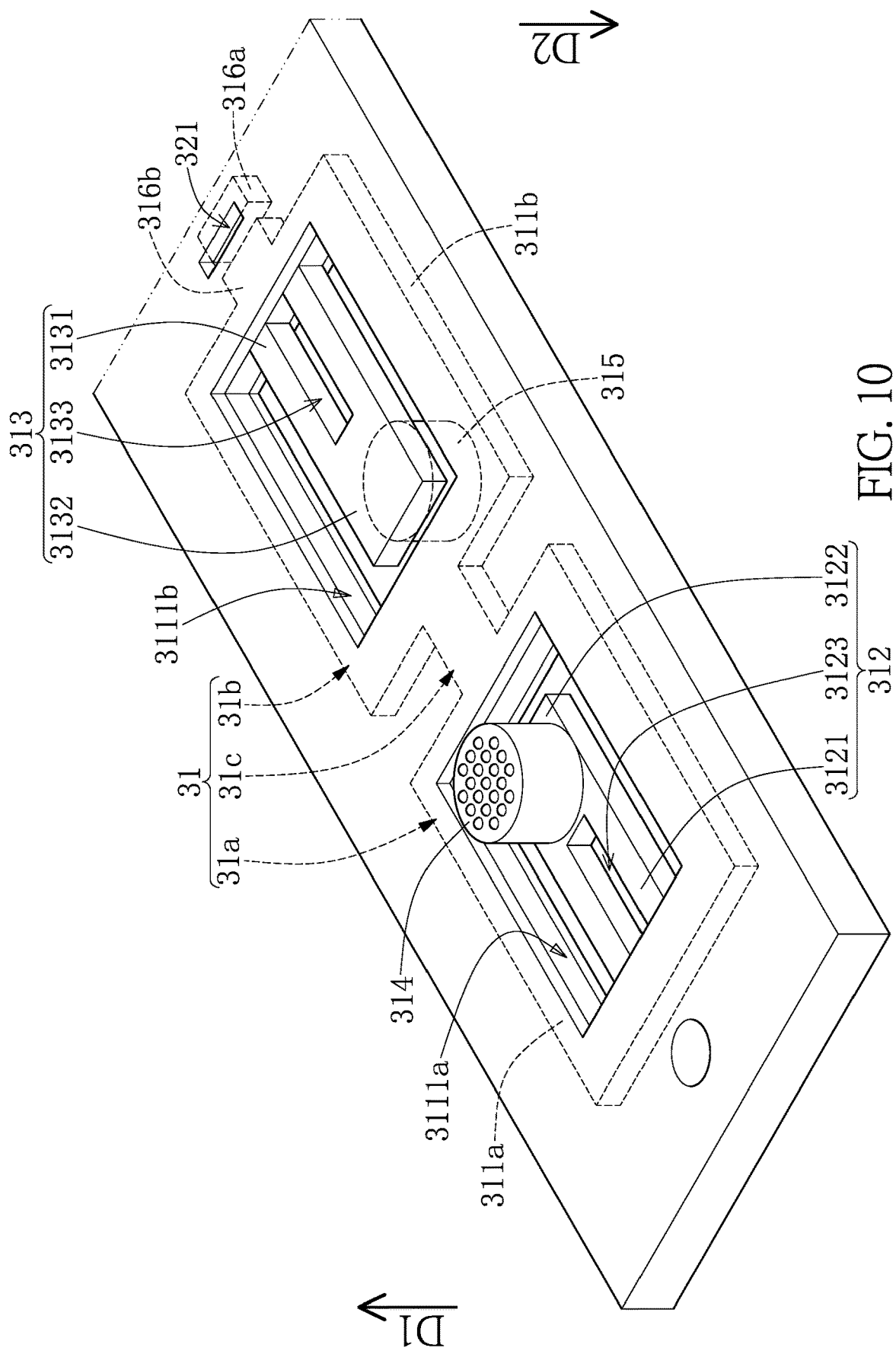
FIG. 10 is a top view showing the board-like connector in still yet another configuration according to the embodiment of the present disclosure.

In addition, the dual-ring bridge 31 can abut against two boards (e.g., the signal transmission board 1 and the testing circuit board 2) through the first abutting column 314 and the second abutting column 315, respectively. A structure of the first abutting column 314 or the second abutting column 315 configured to abut against one of the two boards in the present embodiment is an arced surface that can be adjusted or changed according to design requirements, and the present disclosure is not limited thereto. For example, in other embodiments of the present disclosure not shown in the drawings, the structure of the first abutting column 314 or the second abutting column 315 can be a slanting surface; or, as shown in FIG. 10, the structure of the first abutting column 314 or the second abutting column 315 can include a plurality of protrusions.

The insulating layer 32 in the present embodiment is made of a high-temperature resistant material (e.g., the insulating layer 32 can be made of a plastic material withstanding at least 300 degrees Celsius). The first carrying ring 311a, the second carrying ring 311b, the bridging segment 31c, the at least one first residual arm 316a, and the at least one second residual arm 316b of each of the dual-ring bridges 31 can be connected to or embedded in the insulating layer 32.

In the present embodiment, the insulating layer 32 can be connected to each of the dual-ring bridges 31 in a molding manner or an adhering manner, so that the first carrying ring 311a, the second carrying ring 311b, the bridging segment 31c, the at least one first residual arm 316a, and the at least one second residual arm 316b of each of the dual-ring bridges 31 are embedded in the insulating layer 32. Moreover, the first abutting column 314 and the second abutting column 315 of each of the dual-ring bridges 31 can respectively protrude from two opposite sides of the insulating layer 32.

Specifically, the insulating layer 32 has a plurality of separation holes 321 penetrating there-through, any two of the dual-ring bridges 31 adjacent to each other are provided with one of the separation holes 321 there-between, and a free end of the at least one first residual arm 316a and/or a free end of the at least one second residual arm 316b of each of the dual-ring bridges 31 are exposed from one of the separation holes 321. In other words, before the separation holes 321 are formed in the insulating layer 32 of the board-like connector 3, at least two of the residual arms (e.g., the first residual arm 316a and the second residual arm 316b adjacent to each other) of any two of the dual-ring bridges 31 are connected to each other, thereby facilitating the manufacturing of the dual-ring bridges 31. After that, the at least two of the residual arms (e.g., the first residual arm 316a and the second residual arm 316b adjacent to each other) connected to each other can be cut off to be electrically isolated to each other by forming the separation holes 321 in the insulating layer 32.

The above description describes the structure of each of the signal transmission board 1, the testing circuit board 2, and the board-like connector 3, and the following description describes the connection relationship of the signal transmission board 1, the testing circuit board 2, and the board-like connector 3. The first abutting columns 314 of the dual-ring bridges 31 respectively abut against the connection pads 13 of the signal transmission board 1, and the second abutting columns 315 of the dual-ring bridges 31 respectively abut against the metal pads 21 of the testing circuit board 2. In other words, the first abutting column 314 of any one of the dual-ring bridges 31 abuts against one of the two boards, and the second abutting column 315 of any one of the dual-ring bridges 31 abuts against another one of the two boards.

Moreover, as shown in FIG. 1 and FIG. 2, in any one of the dual-ring bridges 31 of the present embodiment, the signal transmission board 1 and the testing circuit board 2 clamp the first abutting column 314 and the second abutting column 315, so that the first cantilever 312 and the second cantilever 313 are elastically bent to allow two opposite ends of any one of the first abutting column 314 and the second abutting column 315 to respectively protrude from the two opposite sides of the insulating layer 32 (shown in FIG. 4), thereby effectively decreasing a thickness of the board-like connector 3, but the present disclosure is not limited thereto. For example, the force generated by using the signal transmission board 1 and the testing circuit board 2 to jointly clamp the board-like connector 3 can be adjusted according to design requirements (shown in FIG. 3).

As shown in FIG. 1, the probe head 4 is disposed on the top surface 11 of the signal transmission board 1, and the probe head 4 can be electrically coupled to the testing circuit board 2 through the signal transmission board 1 and the board-like connector 3. The probe head 4 includes a retainer 41 and a plurality of conductive probes 42 that pass through and are retained by the retainer 41. An end of each of the conductive probes 42 (e.g., a bottom end of each of the conductive probes 42 shown in FIG. 1) passes through the retainer 41 and abuts against the top surface 11 of the signal transmission board 1, and another end of each of the conductive probes 42 (e.g., a top end of each of the conductive probes 42 shown in FIG. 1) passes through the retainer 41 and is configured to detachably abut against a device under test (DUT) (e.g., a semi-conductor wafer).

It should be noted that the conductive probe 42 of the present embodiment is an elongated structure being conductive and flexible, and the conductive probe 42 of the present embodiment is not limited to a rectangular probe, a round probe, or other probes. In addition, the probe head 4 of the present embodiment is a vertical probe head, but the specific structure of the probe head 4 can be adjusted or changed according to design requirements and is not limited to the present embodiment.

Beneficial Effects of the Embodiment

In conclusion, in the wafer testing assembly (or the board-like connector) of the present disclosure, the first abutting column and the second abutting column of any one of the dual-ring bridges elastically abut against the two boards (e.g., the signal transmission board and the testing circuit board) by being in cooperation with the first cantilever and the second cantilever, thereby without using any soldering manner. Moreover, any one of the dual-ring bridges is detachably abutting against the two boards, so that the components of the wafer testing assembly can be easily separated from each other for facilitating the inspection and maintenance of the wafer testing assembly.

Specifically, in the wafer testing assembly (or the board-like connector) of the present disclosure, the first cantilever and the second cantilever of any one of the dual-ring bridges are respectively coplanar with the first carrying ring and the second carrying ring for increasing the manufacturing yield of the board-like connector, and when the first cantilever (or the second cantilever) of any one of the dual-ring bridges is bent by receiving an external force, a stress would be uniformly distributed on the first cantilever (or the second cantilever), thereby effectively decreasing the breaking possibility of the first cantilever (or the second cantilever) from the first carrying ring (or the second carrying ring).

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A wafer testing assembly, comprising:
   a signal transmission board configured to be connected to a probe head, wherein the signal transmission board includes a plurality of connection pads;
   a testing circuit board configured to be electrically coupled to a testing apparatus, wherein the testing circuit board includes a plurality of metal pads spaced apart from each other; and
   a board-like connector sandwiched between the signal transmission board and the testing circuit board, wherein the board-like connector includes:
      a plurality of dual-ring bridges spaced apart from each other, wherein each of the dual-ring bridges includes:
         a first abutting segment including a first carrying ring, a first cantilever extending from an inner lateral wall of the first carrying ring, and a first abutting column that extends from the first cantilever along a first direction;
         a second abutting segment including a second carrying ring, a second cantilever extending from an inner lateral wall of the second carrying ring, and a second abutting column that extends from the second cantilever along a second direction opposite to the first direction; and
         a bridging segment connecting the first carrying ring and the second carrying ring; and
      an insulating layer connecting the first carrying rings and the second carrying rings of the dual-ring bridges, wherein the first abutting column and the second abutting column of each of the dual-ring bridges respectively protrude from two opposite sides of the insulating layer;
      wherein the first abutting columns of the dual-ring bridges respectively abut against the connection pads of the signal transmission board, and the second abutting columns of the dual-ring bridges respectively abut against the metal pads of the testing circuit board;
   wherein the signal transmission board and the testing circuit board are electrically coupled to each other through the board-like connector.

2. The wafer testing assembly according to claim 1, wherein in any one of the dual-ring bridges, the first cantilever includes a first arm portion connected to the corresponding inner lateral wall and a first free end portion that extends from the first arm portion, the first abutting column is integrally connected to the first free end portion, and the first abutting column is spaced apart from the corresponding inner lateral wall by a distance being within a range from 100 μm to 600 μm.

3. The wafer testing assembly according to claim 2, wherein in any one of the dual-ring bridges, the first arm portion has a first adjustment hole penetrating there-through and extending from the first free end portion to the corresponding inner lateral wall.

4. The wafer testing assembly according to claim 2, wherein in any one of the dual-ring bridges, the first abutting column has a first thickness with respect to the first free end portion, and the first thickness of the first abutting column is 100% to 300% of a thickness of the first free end portion, and wherein in any one of the dual-ring bridges, the second cantilever includes a second arm portion connected to the corresponding inner lateral wall and a second free end portion that extends from the second arm portion, the second abutting column is integrally connected to the second free end portion, the second abutting column is spaced apart from the corresponding inner lateral wall by a distance being within a range from 100 μm to 600 μm, the second abutting column has a second thickness with respect to the second free end portion, and the second thickness of the second abutting column is 100% to 300% of a thickness of the second free end portion.

5. The wafer testing assembly according to claim 1, further comprising a screw set that is inserted into the signal transmission board, the board-like connector, and the testing circuit board so as to fix and maintain a relative position of the signal transmission board, the board-like connector, and the testing circuit board, and wherein any electrical path in the signal transmission board, the board-like connector, and the testing circuit board is established without using any soldering material.

6. The wafer testing assembly according to claim 1, wherein the insulating layer has a plurality of separation holes penetrating there-through, each of the dual-ring bridges includes at least one first residual arm extending from an outer lateral wall of the first carrying ring, and a free end of the at least one first residual arm of each of the dual-ring bridges is exposed from one of the separation holes.

7. The wafer testing assembly according to claim 1, wherein the bridging segment of each of the dual-ring bridges is embedded in the insulating layer.

8. The wafer testing assembly according to claim 1, wherein in any one of the dual-ring bridges, the signal transmission board and the testing circuit board clamp the first abutting column and the second abutting column, so that the first cantilever and the second cantilever are elastically bent to allow two opposite ends of any one of the first abutting column and the second abutting column to respectively protrude from the two opposite sides of the insulating layer.

9. A board-like connector for being sandwiched between two boards so as to allow the two boards are electrically coupled to each other by the board-like connector, the board-like connector comprising:
- a plurality of dual-ring bridges spaced apart from each other, wherein each of the dual-ring bridges includes:
  - a first abutting segment including a first carrying ring, a first cantilever extending from an inner lateral wall of the first carrying ring, and a first abutting column that extends from the first cantilever along a first direction;
  - a second abutting segment including a second carrying ring, a second cantilever extending from an inner lateral wall of the second carrying ring, and a second abutting column that extends from the second cantilever along a second direction opposite to the first direction; and
  - a bridging segment connecting the first carrying ring and the second carrying ring; and
- an insulating layer connecting the first carrying rings and the second carrying rings of the dual-ring bridges, wherein the first abutting column and the second abutting column of each of the dual-ring bridges respectively protrude from two opposite sides of the insulating layer;
- wherein the first abutting columns of the dual-ring bridges are configured to abut against one of the two boards, and the second abutting columns of the dual-ring bridges are configured to abut against another one of the two boards.

10. A dual-ring bridge of a board-like connector for being sandwiched between two boards so as to allow the two boards are electrically coupled to each other by the dual-ring bridge, the dual-ring bridge comprising:
- a first abutting segment including a first carrying ring, a first cantilever extending from an inner lateral wall of the first carrying ring, and a first abutting column that extends from the first cantilever along a first direction;
- a second abutting segment including a second carrying ring, a second cantilever extending from an inner lateral wall of the second carrying ring, and a second abutting column that extends from the second cantilever along a second direction opposite to the first direction; and
- a bridging segment connecting the first carrying ring and the second carrying ring;
- wherein the first abutting column of the dual-ring bridge is configured to abut against one of the two boards, and the second abutting column of the dual-ring bridge is configured to abut against another one of the two boards.

\* \* \* \* \*